US012598837B2

(12) United States Patent
Kumagai et al.

(10) Patent No.: US 12,598,837 B2
(45) Date of Patent: Apr. 7, 2026

(54) PHOTOVOLTAIC DEVICE

(71) Applicant: KYOCERA SOC Corporation, Yokohama (JP)

(72) Inventors: Satoru Kumagai, Kanagawa (JP); Yuya Shibasaki, Kanagawa (JP); Tomonari Yahata, Kanagawa (JP)

(73) Assignee: KYOCERA SOC Corporation, Yokohama (JP)

( * ) Notice: Subject to any disclaimer, the term of this patent is extended or adjusted under 35 U.S.C. 154(b) by 12 days.

(21) Appl. No.: 18/581,661

(22) Filed: Feb. 20, 2024

(65) Prior Publication Data

US 2024/0429336 A1 Dec. 26, 2024

(30) Foreign Application Priority Data

Jun. 23, 2023 (JP) ................................. 2023-103059

(51) Int. Cl.
　H10F 77/42 (2025.01)
　H10F 19/00 (2025.01)
(52) U.S. Cl.
　CPC ............. H10F 77/42 (2025.01); H10F 19/00 (2025.01)
(58) Field of Classification Search
　CPC ................................. H10F 77/42; H10F 19/00
　See application file for complete search history.

(56) References Cited

U.S. PATENT DOCUMENTS

| | | | |
|---|---|---|---|
| 4,642,413 A | 2/1987 | Ovshinsky | |
| 7,460,981 B2 | 12/2008 | Bultman et al. | |

| | | | | |
|---|---|---|---|---|
| 2005/0166952 A1* | 8/2005 | Ransquin | .............. | H10F 77/488 |
| | | | | 136/246 |
| 2013/0135758 A1* | 5/2013 | Kim | ........................ | F24S 23/31 |
| | | | | 359/738 |
| 2015/0224601 A1 | 8/2015 | Mitra | | |

FOREIGN PATENT DOCUMENTS

| | | |
|---|---|---|
| JP | S5789283 | 6/1982 |
| JP | 2006310024 | 11/2006 |
| WO | WO2014019814 A1 | 2/2014 |

OTHER PUBLICATIONS

Garnett, et al., "Photonics for Photovoltaics: Advances and Opportunities", ACS Photonics, vol. 8, pp. 61-70.
Laura Rodriguez, Publisher, "Solar panel orientation: How using East-West structures improves the performance of your project", https://ratedpower.com/blog/solar-panel-orientation/, Jun. 1, 2021, downloaded Feb. 19, 2024, 12 pages.

* cited by examiner

*Primary Examiner* — Golam Mowla
(74) *Attorney, Agent, or Firm* — Dority & Manning, P.A.

(57) ABSTRACT

A photovoltaic device includes a first photovoltaic cell configured to perform photovoltaic power generation by using, as irradiation light, light generated by a light source device including a laser light source or a discharge lamp light source. The first photovoltaic cell is arranged such that maximum irradiance (a light amount per unit area in a light receiving portion of the first photovoltaic cell at a time when a light amount of the irradiation light applied to the first photovoltaic cell is at a maximum) does not exceed maximum power generation effective irradiance (a maximum value of a light amount per unit area that can be used by the first photovoltaic cell for power generation).

2 Claims, 7 Drawing Sheets

Related Art

PHOTOVOLTAIC DEVICE

CROSS-REFERENCE TO RELATED APPLICATIONS

This application claims priority to Japanese Patent Application No. 2023-103059, filed on Jun. 23, 2023, which is incorporated herein by reference in its entirety for all purposes.

TECHNICAL FIELD

The present invention relates to a photovoltaic device, and more particularly, to a photovoltaic device including a photovoltaic cell that performs photovoltaic power generation by using, as irradiation light, light generated by a light source device including a laser light source or a discharge lamp light source.

BACKGROUND ART

In recent years, there has been increasing interest in the energy harvesting technology that harvests and uses a small amount of energy from the surrounding environment, and more particularly, in the environmental power generation technology that uses energy from the surrounding environment to perform power generation. As an application of the environmental power generation technology to a light source device that generates strong light such as laser light or discharge lamp light unlike photovoltaic power generation using weak light such as sunlight or indoor light, WO2014/019814A1, U.S. Pat. Nos. 7,460,981, 4,642,413, JP2006-310024A, JPS57-89283A, and the like propose using the light, which would normally be thrown away without being used, by applying the light to a photovoltaic device such as a solar cell for power generation.

The photovoltaic device includes a photovoltaic cell, and is a device that performs photovoltaic power generation using the light applied to the photovoltaic cell. In such a photovoltaic cell, a maximum power generation amount per unit area is determined. More specifically, the maximum power generation amount per unit area is determined by the type of the photovoltaic cell such as amorphous silicon and dye-sensitized, regardless of the irradiation light applied thereto.

Once the type of photovoltaic cell and the wavelength distribution of the light applied to the photovoltaic cell are determined, the photovoltaic power generation efficiency at a time when the light of that wavelength distribution is applied to that type of the photovoltaic cell is determined. As the maximum power generation amount per unit area of the photovoltaic cell is divided by the photovoltaic power generation efficiency, a maximum light amount per unit area of the photovoltaic cell that can be used for power generation at a time when the light of that wavelength distribution is applied to that type of the photovoltaic cell is determined.

When the light amount per unit area on an irradiated surface (a surface of the photovoltaic cell) of the irradiation light applied to the photovoltaic cell exceeds the maximum light amount per unit area of the photovoltaic cell that can be used for power generation, a portion of the irradiation light corresponding to the excess is not used for power generation, and is thrown away as heat in the end.

A laser light source, a discharge lamp light source, and the like, which have the rated output set in consideration of various conditions such as the stability and lifespan of these light sources, are preferably used at the rated output.

On the other hand, when such a light source is used, the output to a device (hereinafter referred to as "light using device") that uses the light from the light source may be set lower than the rated output of the light source to prevent the light using device from being damaged. In such a case, the output from the light source may be set to the rated output, and an external device that is different from the light source and the light using device may reduce the output to the light using device relative to the output from the light source. The external device may be composed of an attenuator or a mirror with controlled transmittance.

When the external device that is different from the light source and the light using device reduces the output, the actual output inevitably becomes lower than the rated output, which causes the difference (hereinafter referred to as "differential output") between the actual output and the rated output. The differential output is absorbed by the so-called damper, and converted to heat somewhere in the end.

WO2014/019814A1, U.S. Pat. Nos. 7,460,981, 4,642, 413, JP2006-310024A, JPS57-89283A, and the like propose applying the differential output to a photovoltaic cell and using the differential output for power generation without absorbing or reflecting the differential output by the damper.

In a case where the excess light from the light source device including a laser light source or a discharge lamp light source is absorbed by the damper, the energy of the light absorbed by the damper is lost. On the other hand, in a case where the excess light is not absorbed by the damper and is applied to the photovoltaic cell as it is, the light amount of the irradiation light per unit area on the irradiated surface may exceed the maximum light amount (hereinafter sometimes referred to as "maximum power generation effective irradiance") per unit area of the photovoltaic cell that can be used for power generation. In such a case, a portion of the light that exceeds the maximum power generation effective irradiance is not used for power generation, and is thrown away as heat.

SUMMARY OF THE INVENTION

In view of the above background, an object of the present invention is to provide a technology that can reduce the light to be thrown away without being used for power generation due to the limit of the maximum light amount per unit area of the photovoltaic cell that can be used for power generation, in a photovoltaic device that performs power generation by using the extra light from a light source device that generates strong light such as laser light and discharge lamp light.

To achieve such an object, one aspect of the present invention provides a photovoltaic device (2) comprising a first photovoltaic cell (4) configured to perform photovoltaic power generation by using, as irradiation light, light generated by a light source device (1) including a laser light source or a discharge lamp light source, wherein the first photovoltaic cell is arranged such that maximum irradiance (a light amount per unit area in a light receiving portion of the first photovoltaic cell at a time when a light amount of the irradiation light applied to the first photovoltaic cell is at a maximum) does not exceed maximum power generation effective irradiance (a maximum value of a light amount per unit area that can be used by the first photovoltaic cell for power generation).

As shown in FIG. 7, a photovoltaic cell 4 of a conventional photovoltaic device 102 is arranged substantially perpendicularly to the irradiation light 3 coming from a light source device 1, and the light incident on the conventional photovoltaic device 102 is applied to the photovoltaic cell 4 as it is. The maximum value of the irradiation light 3 applied to the photovoltaic cell 4 is defined as "maximum irradiation light amount Imax", an area of a portion of the photovoltaic cell 4 that receives the irradiation light 3 is defined as "light receiving area S", and the maximum value of the light amount (hereinafter referred to as "power generation effective irradiance") per unit area that can be used by the photovoltaic cell 4 for power generation is defined as "maximum power generation effective irradiance Umax". A value (Umax×S) acquired by multiplying the maximum power generation effective irradiance Umax by the light receiving area S is maximum power generation light amount of the photovoltaic cell 4. In the arrangement of the conventional photovoltaic device 102, in a case where the maximum irradiation light amount Imax exceeds the maximum power generation light amount (Umax×S) of the photovoltaic cell 4, the light "Imax-Umax×S" of the irradiation light 3 is thrown away without being used for power generation when the irradiation light 3 of the maximum irradiation light amount Imax is applied to the photovoltaic cell 4.

In the photovoltaic device according to the above aspect of the present invention, the first photovoltaic cell (hereinafter, sometimes abbreviated as "photovoltaic cell") is arranged such that an actual light receiving area S' of a portion of the photovoltaic cell that receives the irradiation light does not fall below the value acquired by dividing the maximum irradiation light amount Imax by the maximum power generation effective irradiance Umax. According to this configuration, even when the light amount of the irradiation light applied to the photovoltaic cell is the maximum irradiation light amount Imax, the amount of the irradiation light that is thrown away without being used for power generation is reduced.

Hereinafter, an example of the conventional photovoltaic device including a photovoltaic cell will be described. The maximum power generation effective irradiance Umax of the photovoltaic cell is 0.015 W/cm², and the light receiving area S of the photovoltaic cell is 1 cm². For example, the maximum irradiation light amount Imax is 0.03 W.

In the conventional photovoltaic device, since the photovoltaic cell is not inclined relative to the irradiation light, the maximum irradiation light amount Imax is 0.03 W, the maximum power generation effective irradiance Umax is 0.015 W/cm², and the light receiving area S is 1 cm². In contrast to maximum irradiation light amount Imax of 0.03 W, the maximum power generation light amount Umax×S is 0.015 W. Since "Imax>Umax×S" is satisfied, a portion of the irradiation light of 0.03 W is not used for photovoltaic power generation, and the amount thereof is "Imax-Umax× S=0.03−0.015=0.015 (W)".

Next, an example of the above aspect of the present invention will be described. In this example, an inclination angle θ of a normal line (a line normal to a light receiving surface of a photovoltaic cell) relative to the irradiation light is set to 65 degree.

The maximum power generation effective irradiance Umax of the photovoltaic cell is 0.015 W/cm², the light receiving area S of the photovoltaic cell is 1 cm², and the maximum irradiation light amount Imax of the irradiation light is 0.03 W.

The photovoltaic cell is inclined relative to the irradiation light at the inclination angle θ of 65 degree, the maximum irradiation light amount Imax is 0.03 W, the maximum power generation effective irradiance Umax is 0.015 W/cm², the light receiving area S is 1 cm², and cos θ is 0.423 since the inclination angle θ is 65 degree. In contrast to the maximum irradiation light amount Imax of 0.03 W, the maximum power generation light amount (Umax×S/cos θ) is 0.0355 W. Since "Imax<Umax×S/cos θ" is satisfied, all of the irradiation light of 0.03 W is used for photovoltaic power generation. Since "Imax (0.03 W)<Umax (0.015 W/cm²)× S (1 cm²)/cos θ (65 degree)=0.0355 (W)" is satisfied, all of the irradiation light corresponding to the maximum irradiation light amount Imax of 0.03 W is used for power generation without being thrown away.

In the above aspect of the present invention, preferably, the photovoltaic device further comprises a second photovoltaic cell (14) spaced away from the photovoltaic cell (the first photovoltaic cell), a portion of the irradiation light applied to the photovoltaic cell is reflected by the photovoltaic cell and becomes reflected irradiation light (13) applied to the second photovoltaic cell, and the second photovoltaic cell is inclined relative to the reflected irradiation light.

Further, in the above aspect of the present invention, the second inclination angle θ2 of the second photovoltaic cell relative to the reflected irradiation light is determined based on maximum irradiation light amount Imax2 of the reflected irradiation light applied to the second photovoltaic cell, maximum power generation effective irradiance Umax2 of the second photovoltaic cell, and a light receiving area S2 of the second photovoltaic cell. Accordingly, the inclination angle θ of the first photovoltaic cell relative to the irradiation light and the second inclination angle θ2 of the second photovoltaic cell relative to the reflected irradiation light may be different from each other.

In a photovoltaic device according to another aspect of the present invention, an irradiation light diffusing optical element is applied to the irradiation light. In the following, an example of the present invention to which the irradiation light diffusing optical element is applied will be described. In this example, the number of photovoltaic cells is four. Optical characteristics and an arrangement of the irradiation light diffusing optical element are selected so as to satisfy the following conditions.

The four photovoltaic cells are arranged side by side. The maximum power generation effective irradiance Umax of each photovoltaic cell is 0.015 W/cm², and the light receiving area S of each photovoltaic cell is 1 cm². The irradiation light is diffused by the irradiation light diffusing optical element (5, 15) and applied to the four photovoltaic cells. A convex lens, a concave lens, a convex mirror, a concave mirror, a diffuser plate, or the combination thereof can be used as the irradiation light diffusing optical element. Beam shaping may be used to match the irradiation light with the arrangement of the photovoltaic cells.

The maximum power generation effective irradiance Umax of each photovoltaic cell is 0.015 W/cm², the light receiving area S of each photovoltaic cell is 1 cm², and the maximum irradiation light amount Imax of the irradiation light is 0.03 W. The number M of the photovoltaic cells that receive the irradiation light diffused by the irradiation light diffusing optical element is four. In contrast to the maximum irradiation light amount Imax of 0.03 W, the maximum power generation light amount (Umax×S×M) is calculated as follows:

$$(Umax \times S \times M) = 0.015 \ (W/cm^2) \times 1 \ (cm^2) \times 4 \ (cells) = 0.06 \ (W)$$

Since "Imax (0.03 W)<Umax (0.015 W/cm²)×S (1 cm²)×M (4 cells)=0.06 (W)" is satisfied, all of the irradiation light corresponding to the maximum irradiation light amount Imax of 0.03 W is used for photovoltaic power generation without being thrown away.

In the above aspect of the present invention, preferably, the irradiation light diffusing optical element (5) transmits and diffuses the irradiation light. Alternatively, the irradiation light diffusing optical element (15) reflects and diffuses the irradiation light.

As described above, in the photovoltaic device according to the aspects of the present invention, the irradiation light is used for photovoltaic power generation without being thrown away even when the light amount of the irradiation light applied to the photovoltaic cell is the maximum irradiation light amount.

BRIEF DESCRIPTION OF THE DRAWING(S)

DETAILED DESCRIPTION OF THE INVENTION

Figure 7:
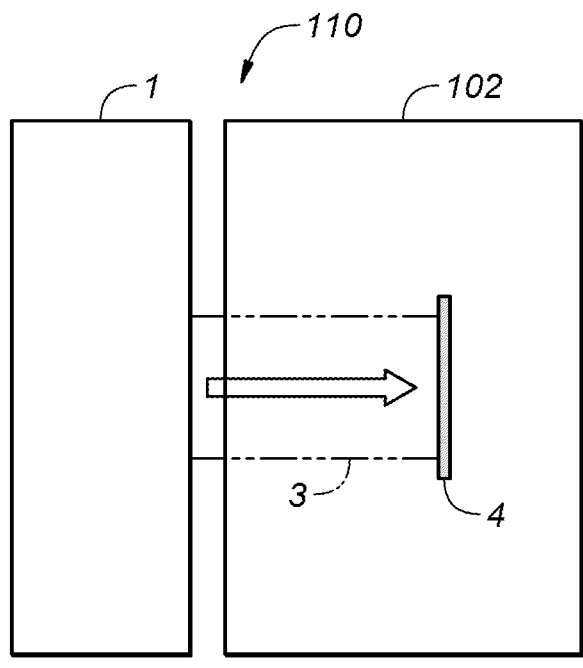
FIG. 7 is a structural diagram of a conventional photovoltaic unit including a conventional photovoltaic device.

First, a conventional photovoltaic unit 110 will be described. FIG. 7 shows a structure of the conventional photovoltaic unit 110. A light source device 1 includes a laser light source or a discharge lamp light source. An irradiation light 3 is emitted from the light source device 1 and incident on a photovoltaic device 102, and then applied to a photovoltaic cell 4 (first photovoltaic cell 4). A maximum value of a light amount of the irradiation light 3 applied to the photovoltaic cell 4 is defined as "maximum irradiation light amount Imax", an area of a portion (i.e., a light receiving portion) of the photovoltaic cell 4 that receives the irradiation light 3 is defined as "light receiving area S", and a maximum value of a light amount per unit area that can be used by the photovoltaic cell 4 for power generation is defined as "maximum power generation effective irradiance Umax". In a case where "Imax>Umax×S" is satisfied, the light amount "Imax-Umax×S" of the irradiation light 3 is thrown away without being used for power generation when the light amount of the irradiation light 3 applied to the photovoltaic cell 4 is the maximum irradiation light amount Imax.

Figure 1:
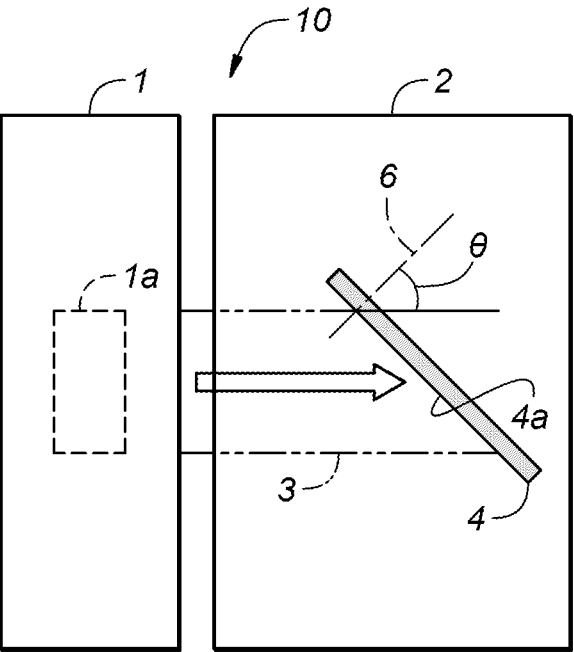
FIG. 1 is a structural diagram of a photovoltaic unit including a photovoltaic device according to a first embodiment of the present invention.

FIG. 1 shows a structure of a photovoltaic unit 10 according to a first embodiment of the present invention. A light source device 1 includes a light source 1a consisting of a laser light source or a discharge lamp light source. A portion of the light generated by the light source 1a is emitted from the light source device 1, and incident on a photovoltaic device 2. Thereafter, the portion of the light becomes an irradiation light 3, and is applied to a photovoltaic cell 4. The photovoltaic cell 4 is inclined relative to the irradiation light 3 at a prescribed inclination angle θ (that is, a normal line 6 normal to a light receiving surface of the photovoltaic cell 4 is inclined relative to the irradiation light 3 at the inclination angle θ). A maximum value of a light amount of the irradiation light 3 applied to the photovoltaic cell 4 is defined as "maximum irradiation light amount Imax", an area of a light receiving portion 4a (a portion that receives the irradiation light 3) of the photovoltaic cell 4 viewed in an irradiation light direction is defined as "light receiving area S", and an actual area (an area viewed in a direction perpendicular to a surface) of the light receiving portion 4a of the photovoltaic cell 4 is defined as "light receiving area S'". The inclination angle θ is set so as to satisfy "Imax<Umax×S'=Umax×S/cos θ". According to this arrangement, the maximum irradiation light amount Imax does not exceed "Umax×S'=Umax×S/cos θ" even when the light amount of the irradiation light 3 applied to the photovoltaic cell 4 is the maximum irradiation light amount Imax. That is, all of the light amount of the irradiation light 3 applied to the photovoltaic cell 4 is used for power generation without being thrown away even when the light amount of the irradiation light 3 applied to the photovoltaic cell 4 is the maximum irradiation light amount Imax. In a case where a plurality of photovoltaic cells 4 are connected in series, a bypass diode may be connected in parallel with each photovoltaic cell 4 so as to prevent a photovoltaic cell 4 that is not exposed to the light from consuming power instead of generating it.

Figure 2:
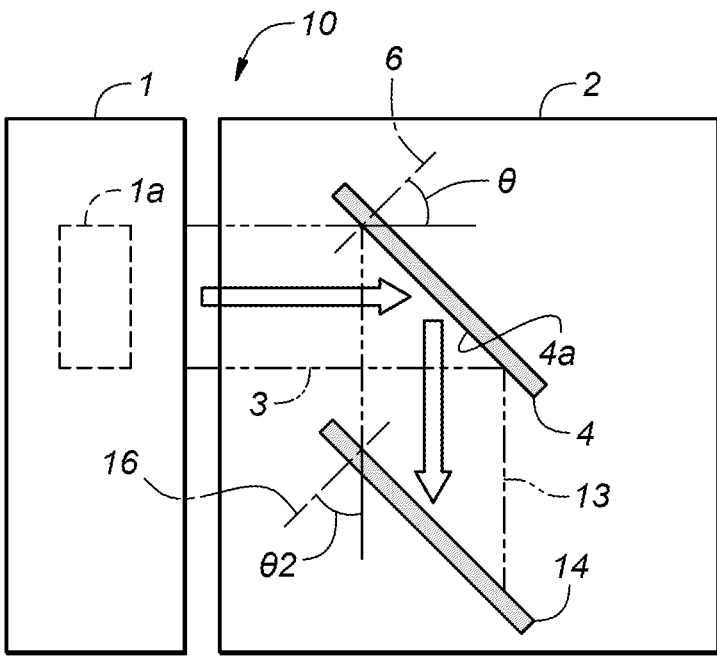
FIG. 2 is a structural diagram of a photovoltaic unit including a photovoltaic device according to a second embodiment of the present invention.

FIG. 2 shows a structure of a photovoltaic unit 10 according to a second embodiment of the present invention. An irradiation light 3 is emitted from a light source device 1 and incident on a photovoltaic device 2, and then applied to a photovoltaic cell 4 (first photovoltaic cell 4). The photovoltaic cell 4 is inclined relative to the irradiation light 3 at an inclination angle θ. In a virtual state where the photovoltaic cell 4 is not inclined relative to the irradiation light 3, an area of a light receiving portion 4a (a portion that receives the irradiation light 3) of the photovoltaic cell 4 is defined as "light receiving area S". In an actual state where the photovoltaic cell 4 is arranged such that a normal line 6 normal to a light receiving surface of the photovoltaic cell 4 is inclined relative to the irradiation light 3 at the inclination angle θ, a light receiving area S' (the area of the light receiving portion 4a of the photovoltaic cell 4) is "S/cos θ". The inclination angle θ is set so as to satisfy "Imax<Umax× S/cos θ". According to this arrangement, "Imax<Umax×S/ cos θ" is satisfied even when the light amount of the irradiation light 3 applied to the photovoltaic cell 4 is the maximum irradiation light amount Imax. That is, all of the irradiation light 3 applied to the photovoltaic cell 4 is used for power generation without being thrown away even when the light amount of the irradiation light 3 applied to the photovoltaic cell 4 is the maximum irradiation light amount Imax. A second photovoltaic cell 14 that receives the irradiation light 3 (hereinafter referred to as "reflected irradiation light 13") reflected by the light receiving surface of the photovoltaic cell 4 is arranged such that a normal line 16 normal to a light receiving surface of the second photovoltaic cell 14 is inclined relative to the reflected irradiation light 13 at a second inclination angle θ2. The reflected irradiation light 13 reflected by the light receiving surface of the photovoltaic cell 4 is also used for power generation by the second photovoltaic cell 14. The second inclination angle θ2 of the second photovoltaic cell 14 relative to the reflected irradiation light 13 and the inclination angle θ of the photovoltaic cell 4 relative to the irradiation light 3 may be different from each other. Another photovoltaic cell 4 may be added behind the second photovoltaic cell 14. In a case where the photovoltaic cells 4 and 14 are connected in series, a bypass diode may be connected in parallel with each photovoltaic cell 4 and 14 so as to prevent a photovoltaic cell 4 or 14 that is not exposed to the light from consuming power.

Figure 3:
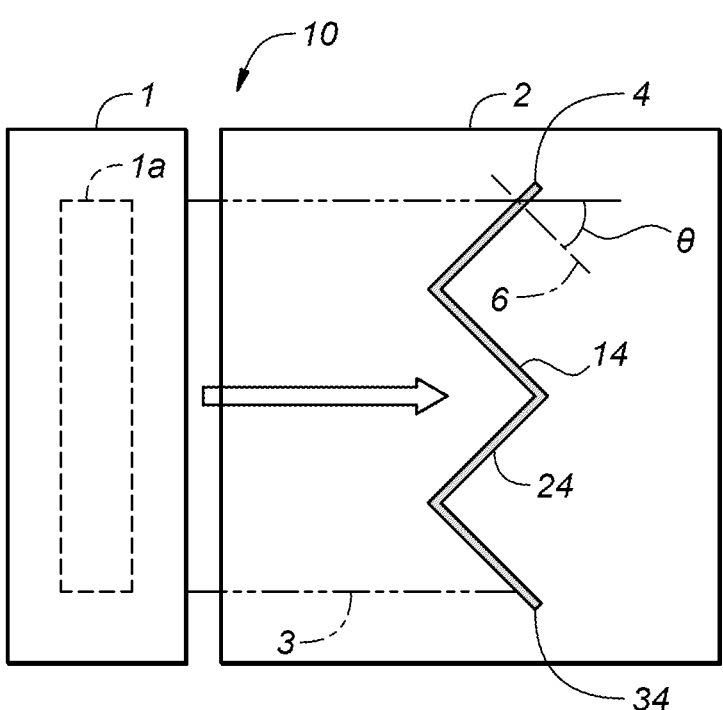
FIG. 3 is a structural diagram of a photovoltaic unit including a photovoltaic device according to a third embodiment of the present invention.

FIG. 3 shows a structure of a photovoltaic unit 10 according to a third embodiment of the present invention. An irradiation light 3 is emitted from a light source device 1 and incident on a photovoltaic device 2, and then applied to a photovoltaic cell 4 (first photovoltaic cell 4), a second photovoltaic cell 14, a third photovoltaic cell 24, and a fourth photovoltaic cell 34. The photovoltaic cell 4, the second photovoltaic cell 14, the third photovoltaic cell 24, and the fourth photovoltaic cell 34 are arranged such that normal lines 6, . . . normal to light receiving surfaces of the photovoltaic cells 4, 14, 24, and 34 are inclined relative to the irradiation light 3 at an inclination angle θ. A maximum value of a light amount of the irradiation light 3 applied to the photovoltaic cell 4 is defined as "maximum irradiation light amount Imax", an area of a light receiving portion (a portion that receives the irradiation light 3) of the photovoltaic cell 4 viewed in an irradiation light direction is defined as "light receiving area S". The inclination angle θ is set so as to satisfy "Imax<Umax×S/cos θ". According to this arrangement, "Imax<Umax×S/cos θ" is satisfied even when the light amount of the irradiation light 3 applied to the photovoltaic cell 4 is the maximum irradiation light amount Imax. That is, all of the irradiation light 3 applied to the photovoltaic cell 4 is used for power generation without being thrown away even when the light amount of the irradiation light 3 applied to the photovoltaic cell 4 is the maximum irradiation light amount Imax. Other photovoltaic cells 4 may be arranged so as to repeat the pattern of the photovoltaic cell 4, the second photovoltaic cell 14, the third photovoltaic cell 24, and the fourth photovoltaic cell 34. In a case where the photovoltaic cells 4, 14, 24, and 34 are connected in series, a bypass diode may be connected in parallel with each photovoltaic cell 4, 14, 24, and 34 so as to prevent a photovoltaic cell 4, 14, 24, or 34 that is not exposed to the light from consuming power.

Pyramidal or tapered structures are disclosed in "Photonics for Photovoltaics: Advances and Opportunities, Erik C. Garnett, Bruno Ehrler, Albert Polman, and Esther Alarcon-Llado" (hereinafter referred to as "Document 1") and "Solar panel orientation: How using East-West structures improves the performance of your project, Laura Rodriguez, 1 June, 21" (hereinafter referred to as "Document 2"). However, the pyramidal or tapered structure of Document 1 is aimed at increasing power generation efficiency by adding a pyramidal or tapered texture to a surface of a solar cell to increase an amount of light trapped inside the solar cell. Document 1 does not suggest the maximum power generation effective irradiance Umax of the photovoltaic cell 4 of the above embodiments.

The tilted arrangement structure of Document 2 is proposed as a structure in which solar panels are arranged tilted. This tilted arrangement structure is aimed at avoiding occurrence of a period during which no power can be generated in a case where a plurality of solar panels oriented toward one direction are arranged outdoors and the direction of the sun changes over time. Document 2 does not suggest the maximum power generation effective irradiance Umax of the photovoltaic cell 4 of the above embodiments.

Figure 4:
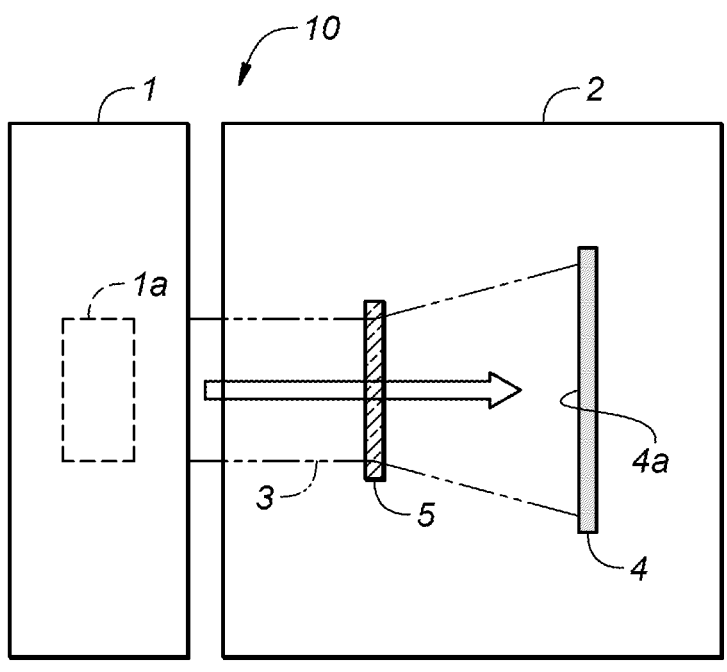
FIG. 4 is a structural diagram of a photovoltaic unit including a photovoltaic device according to a fourth embodiment of the present invention.

FIG. 4 shows a structure of a photovoltaic unit 10 according to a fourth embodiment of the present invention. An irradiation light 3 is emitted from a light source device 1 and incident on a photovoltaic device 2. Thereafter, the irradiation light 3 passes through an irradiation light diffusing optical element 5 and is applied to a photovoltaic cell 4. As the irradiation light diffusing optical element 5, a convex lens, a concave lens, a convex mirror, a concave mirror, a diffuser plate, a beam expander, or the combination thereof can be used. Beam shaping may be used to match the irradiation light 3 applied to the photovoltaic cell 4 with the arrangement of the photovoltaic cell 4. In a virtual state where the photovoltaic cell 4 receives the irradiation light 3 without passing through the irradiation light diffusing optical element 5, an area of a light receiving portion 4a (a portion that receives the irradiation light 3) of the photovoltaic cell 4 is defined as "light receiving area S". In an actual state where the photovoltaic cell 4 receives the irradiation light 3 through the irradiation light diffusing optical element 5, the area of the light receiving portion 4a of the photovoltaic cell 4 is defined as "light receiving area S'", a maximum value of a light amount of the irradiation light 3 applied to the photovoltaic cell 4 is defined as "maximum irradiation light amount Imax", and a maximum value of a light amount per unit area that can be used by the photovoltaic cell 4 for power generation is defined as "maximum power generation effective irradiance Umax". The optical characteristics and an arrangement of the irradiation light diffusing optical element 5 are selected so as to satisfy "Umax×S<Imax<Umax×S'".

According to this selection, all of the maximum irradiation light amount Imax of the irradiation light 3 is used for photovoltaic power generation. In a virtual state where the photovoltaic cell 4 receives the irradiation light 3 without passing through the irradiation light diffusing optical element 5, "Umax×S<Imax" is satisfied, and thus a portion of the maximum irradiation light amount Imax is not used for photovoltaic power generation. By contrast, in an actual state where the photovoltaic cell 4 receives the irradiation light 3 through the irradiation light diffusing optical element 5, "Imax<Umax×S'" is satisfied, and thus all of the maximum irradiation light amount Imax is used for photovoltaic power generation. That is, the photovoltaic cell 4 is arranged such that the maximum irradiance (the light amount per unit area in the light receiving portion 4a of the photovoltaic cell 4 at a time when the light amount of the irradiation light 3 applied to the photovoltaic cell 4 is at a maximum) does not exceed the maximum power generation effective irradiance Umax (the maximum value of the light amount per unit area that can be used by the photovoltaic cell 4 for power generation). In a case where a plurality of photovoltaic cells 4 are connected in series, a bypass diode may be connected in parallel with each photovoltaic cell 4 to prevent a photovoltaic cell 4 that is not exposed to the light from consuming power.

Figure 5:
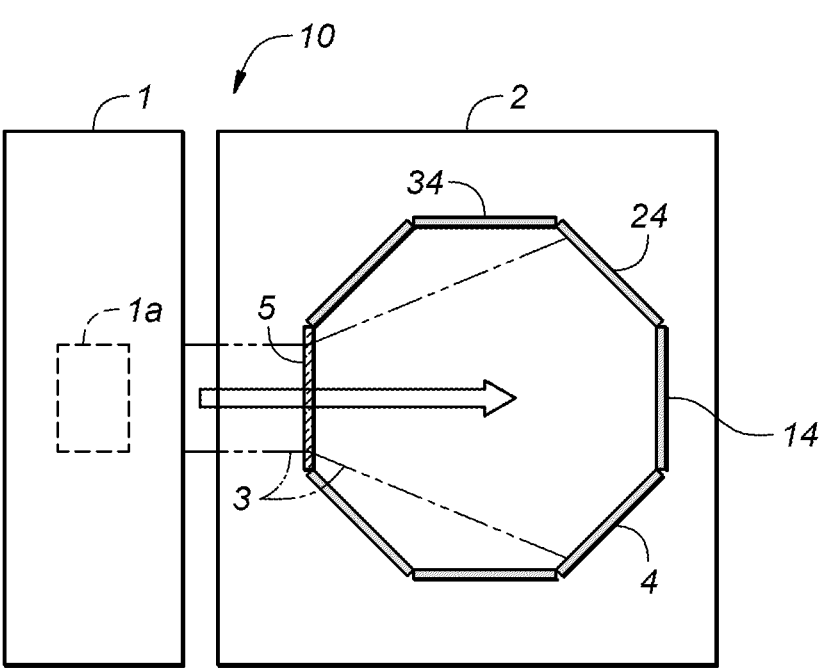
FIG. 5 is a structural diagram of a photovoltaic unit including a photovoltaic device according to a fifth embodiment of the present invention.

FIG. 5 shows a structure of a photovoltaic unit 10 according to a fifth embodiment of the present invention. An irradiation light 3 is emitted from a light source device 1 and incident on a photovoltaic device 2. Thereafter, the irradiation light 3 passes through an irradiation light diffusing optical element 5 and is applied to a photovoltaic cell 4 (a first photovoltaic cell 4), a second photovoltaic cell 14, and a third photovoltaic cell 24. As the irradiation light diffusing optical element 5, a convex lens, a concave lens, a convex mirror, a concave mirror, a diffuser plate, a beam expander, or the combination thereof can be used. In a virtual state where the irradiation light diffusing optical element 5 is not arranged, an area of a light receiving portion (a portion that receives the irradiation light 3) of the photovoltaic cell 4 is defined as "light receiving area S". In an actual state where the irradiation light diffusing optical element 5 is arranged, a total area of light receiving portions (portions that receive the irradiation light 3) of the photovoltaic cell 4, the second photovoltaic cell 14, and the third photovoltaic cell 24 is defined as "light receiving area S'". Optical characteristics and an arrangement of the irradiation light diffusing optical element 5 are selected so as to satisfy "Umax× S<Imax<Umax×S'". According to this selection, in a virtual state where the irradiation light diffusing optical element 5 is not arranged, "Umax×S<Imax" is satisfied when the light amount of the irradiation light 3 applied to the photovoltaic cell 4 is the maximum irradiation light amount Imax. That is, a portion of the maximum irradiation light amount Imax is not used for photovoltaic power generation. By contrast, in an actual state where the irradiation light diffusing optical element 5 is arranged, "Imax<Umax×S'" is satisfied. That is, all of the maximum irradiation light amount Imax of the irradiation light 3 is used for photovoltaic power generation. In the fifth embodiment of the present invention, a plurality of photovoltaic cells 4, 14, 24, 34, . . . are arranged inside a spherical surface in the order of the photovoltaic cell 4, the second photovoltaic cell 14, the third photovoltaic cell 24, . . . . Accordingly, the irradiation light 3 reflected by the surface of each photovoltaic cell 4, 14, 24 is again incident on another photovoltaic cell 34, . . . , and is used for power generation. Other photovoltaic cells 4 may be added so as to cover the inside of the spherical surface. In a case where the photovoltaic cells 4, 14, and 24 are connected in series, a bypass diode may be connected in parallel with each photovoltaic cell 4, 14, and 24 to prevent a photovoltaic cell 4, 14, or 24 that is not exposed to the light from consuming power.

Figure 6:
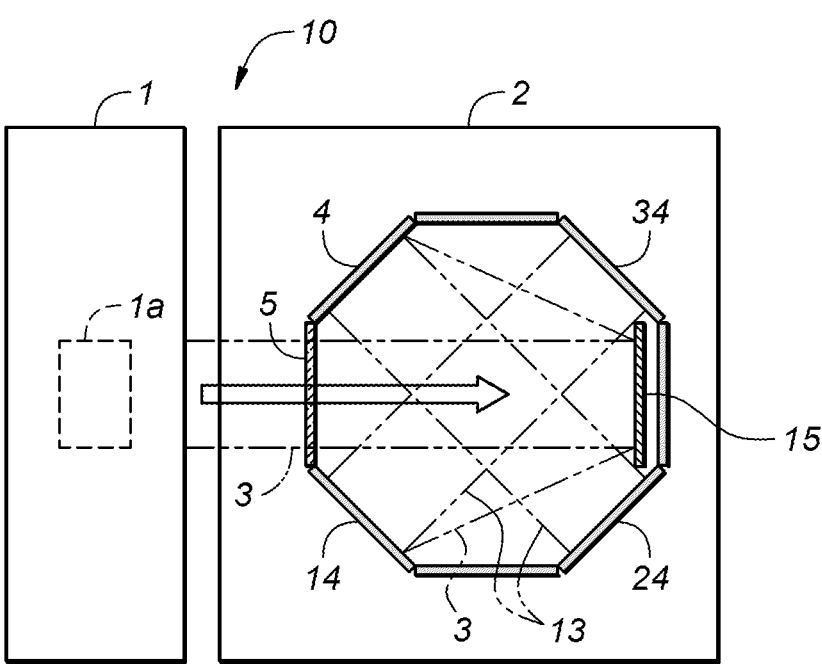
FIG. 6 is a structural diagram of a photovoltaic unit including a photovoltaic device according to a sixth embodiment of the present invention.

FIG. 6 shows a structure of a photovoltaic unit 10 according to a sixth embodiment of the present invention. An irradiation light 3 is emitted from a light source device 1 and incident on a photovoltaic device 2, and is weakly diffused by an irradiation light diffusing optical element 5 (a first irradiation light diffusing optical element 5). Thereafter, the irradiation light 3 is diffused in reflecting directions by a second irradiation light diffusing optical element 15, and is applied to a photovoltaic cell 4 (a first photovoltaic cell 4) and a second photovoltaic cell 14. As the irradiation light diffusing optical element 5 and the second irradiation light diffusing optical element 15, a convex lens, a concave lens, a convex mirror, a concave mirror, a diffuser plate, a beam expander, or the combination thereof can be used. In a virtual state where the irradiation light diffusing optical element 5 and the second irradiation light diffusing optical element 15 are not arranged, an area of a light receiving portion (a portion that receives the irradiation light 3) of the photovoltaic cell 4 is defined as "light receiving area S". In an actual state where the irradiation light diffusing optical element 5 and the second irradiation light diffusing optical element 15 are arranged, a total area of light receiving portions (portions that receive the irradiation light 3 reflected by the second irradiation light diffusing optical element 15) of the photovoltaic cell 4 and the second photovoltaic cell 14 is defined as "light receiving area S'". The optical characteristics and an arrangement of the irradiation light diffusing optical element 5 and the second irradiation light diffusing optical element 15 are selected so as to satisfy "Umax×S<Imax<Umax×S'". According to this arrangement, "Imax<Umax×S'" is satisfied even when the light amount of the irradiation light 3 applied to the photovoltaic cell 4 is the maximum irradiation light amount Imax. That is, all of the irradiation light 3 applied to the photovoltaic cell 4 is used for power generation without being thrown away even when the light amount of the irradiation light 3 applied to the photovoltaic cell 4 is the maximum irradiation light amount Imax. In the sixth embodiment of the present invention, the photovoltaic cell 4 is arranged inside a spherical surface. Accordingly, a third photovoltaic cell 24 that receives a reflected irradiation light 13 reflected by the photovoltaic cell 4 and/or a fourth photovoltaic cell 34 that receives a reflected irradiation light 13 reflected by the second photovoltaic cell 14 may be added. When the photovoltaic cells 4, 14, and 24 are connected in series, a bypass diode may be connected in parallel with each photovoltaic cells 4, 14, and 24 to prevent a photovoltaic cell 4, 14, or 24 that is not exposed to the light from consuming power.

If the irradiation light 3 is incident on a damper, the irradiation light 3 becomes heat. By contrast, according to the above embodiments of the present invention, the photovoltaic device 2 is used in place of the damper, and the irradiation light 3 incident on the photovoltaic device 2 is used for power generation. Accordingly, it is possible to reduce the amount of heat to be generated.

Preferable embodiments of the present invention have been described in the foregoing, but the present invention should not be limited by the foregoing embodiments, and can be modified as appropriate within the scope of the present invention. For example, a portion or all of the structural elements of one embodiment and another may be combined. Further, not all of the structural elements shown in the above embodiments are necessarily indispensable, and the structural elements may be selectively adopted as appropriate within the scope of the present invention.

The invention claimed is:

1. A photovoltaic device comprising:
a first photovoltaic cell configured to perform photovoltaic power generation by using, as irradiation light, light generated by a light source device including a laser light source or a discharge lamp light source; and
a second photovoltaic cell spaced away from the first photovoltaic cell,
wherein the first photovoltaic cell is inclined relative to the irradiation light at a prescribed inclination angle,
when a light amount of the irradiation light applied to the first photovoltaic cell is at a maximum, a light amount per unit area in a light receiving portion of the first photovoltaic cell is defined as a maximum irradiance, and a maximum value of a light amount per unit area that can be used by the first photovoltaic cell for power generation is defined as a maximum power generation effective irradiance, and
the inclination angle of the first photovoltaic cell is set such that
the maximum irradiance exceeds the maximum power generation effective irradiance in a virtual state where the first photovoltaic cell is not inclined relative to the irradiation light, and
the maximum irradiance does not exceed the maximum power generation effective irradiance in an actual state where the first photovoltaic cell is inclined relative to the irradiation light, and
wherein a portion of the irradiation light applied to the first photovoltaic cell is reflected by the first photovoltaic cell and becomes reflected irradiation light applied to the second photovoltaic cell, and wherein the second photovoltaic cell is inclined relative to the reflected irradiation light.

2. The photovoltaic device according to claim 1, wherein the inclination angle of the first photovoltaic cell relative to the irradiation light and an inclination angle of the second photovoltaic cell relative to the reflected irradiation light are different from each other.

\* \* \* \* \*